United States Patent [19]

Ryan

[11] Patent Number: 4,652,974
[45] Date of Patent: Mar. 24, 1987

[54] METHOD AND STRUCTURE FOR EFFECTING ENGINEERING CHANGES IN A MULTIPLE DEVICE MODULE PACKAGE

[75] Inventor: Charles T. Ryan, Poughkeepsie, N.Y.

[73] Assignee: International Business Machines Corporation, Armonk, N.Y.

[21] Appl. No.: 792,708

[22] Filed: Oct. 28, 1985

[51] Int. Cl.$^4$ .............................................. H05K 1/18
[52] U.S. Cl. ...................................... 361/395; 29/847
[58] Field of Search ............... 361/395, 403, 409, 410, 361/414, 415, 416, 417, 419, 420; 29/846, 847

[56] References Cited

U.S. PATENT DOCUMENTS

| | | | |
|---|---|---|---|
| 3,378,920 | 4/1968 | Cone | 29/847 |
| 4,245,273 | 1/1981 | Feinberg et al. | 361/382 |
| 4,371,744 | 2/1983 | Badet et al. | 361/409 |
| 4,489,364 | 12/1984 | Chance et al. | 361/395 |

*Primary Examiner*—A. D. Pellinen
*Assistant Examiner*—Morris Ginsburg
*Attorney, Agent, or Firm*—Wolmar J. Stoffel

[57] ABSTRACT

In a semiconductor module with a substrate having a plurality of semiconductor devices mounted on the top surface, an internal metallurgy system interconnecting the devices, an auxiliary set of conductive lines with periodically occurring surface connecting terminals, engineering change terminals with electrical connections to the device terminals and to the internal metallurgy system, the improvement being
engineering change devices,
terminals on the engineering change devices to establish electrical contact with the engineering change terminals and the surface connecting terminals,
a tailorable metallurgy system which permits establishing selective electrical connections between individual terminals of the engineering change devices, and
deletable surface lines on the substrate to selectively electrically isolate selected engineering change terminals from the internal metallurgy.

17 Claims, 7 Drawing Figures

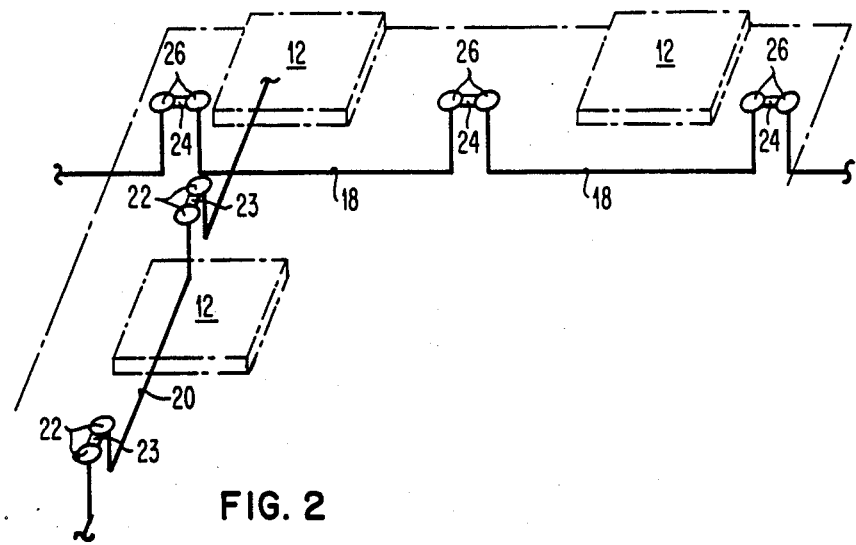
FIG. 2
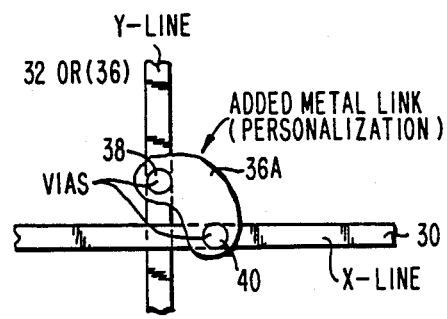
FIG. 3  PERSONALIZED LINK
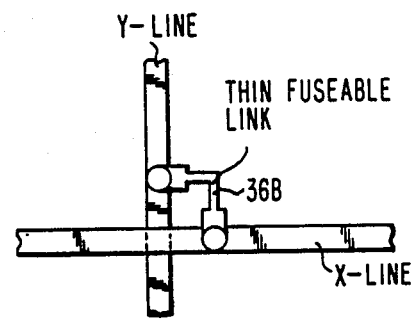
FIG. 4  FUSEABLE LINK

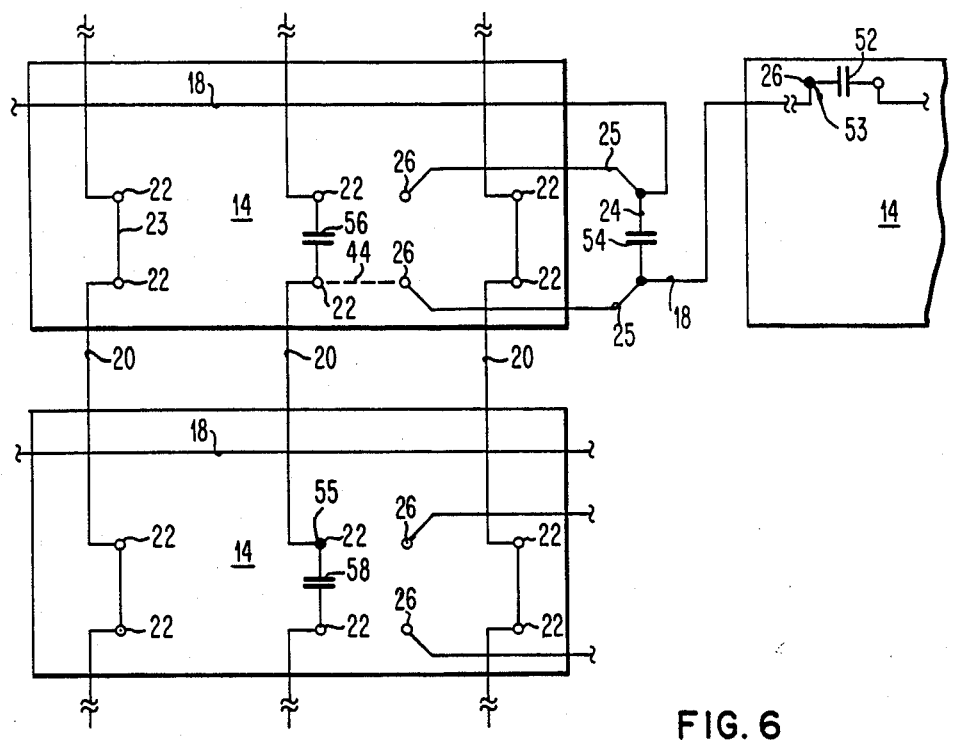
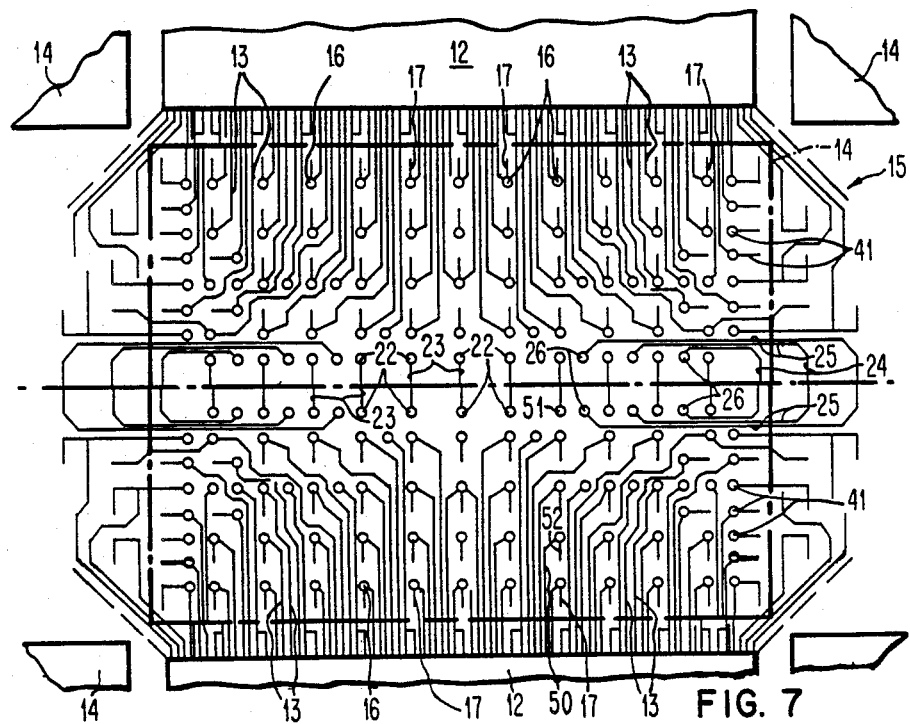
FIG. 6
FIG. 7

METHOD AND STRUCTURE FOR EFFECTING ENGINEERING CHANGES IN A MULTIPLE DEVICE MODULE PACKAGE

DESCRIPTION

1. Technical Field

This invention relates to integrated circuit device carriers, commonly known as packages, on which devices can be bonded for electrical contact and mechanical support, in which permanent electrical connections of the circuits of the chip are made and which provide electrical connections to other circuits of a system such as computers and other electrical products. More particularly, this invention relates to the technique of and structure for making engineering changes in the device carrier to alter the original internal circuit design of the carrier or to correct wiring defects.

2. Background Art

In modern packaging technology, it is known to mount many integrated circuit devices on a substrate containing a printed circuit network that interconnects the devices with each other and to I/O's on the end or opposite side of the substrate. A typical module embodying such a substrate is disclosed and claimed in U.S. Pat. No. 4,245,273, and is also described in IBM Journal Vol. 27, No. 1, January 1983 pgs. 11–19.

Such substrates, normally made of ceramic material, are very complex containing 30 or more layers of green ceramic sheets with thousands of vias and printed lines that form the internal circuit network. After the substrate has been laminated and sintered, there is no practical method of changing the buried internal network. However, it becomes necessary quite frequently to modify the internal circuitry to (1) correct defective lines and/or vias, and (2) make changes to the basic circuitry to accommodate design changes to upgrade the package or modify it by the use of different devices or the like. This contingency was provided for in the substrate described in the references previously cited by the use of engineering change (EC) pads interposed between the device terminals and the circuitry in the device. More specifically, fan-out metallurgy is provided in the top surface layers of the substrate that is joined to the solder pads of each device and also connected to surface EC pads that surround each device. The EC pads each have a deletable central portion with one end of the pad connected to a device pad and the other to buried circuitry in the substrate that interconnects the device with other devices and/or I/O pads on the opposite side of the substrate. To replace a defective buried metallurgy line in the substrate, or modify the circuitry by the addition of different lines, the proper EC pad is severed thus electrically disconnecting the device terminal from the circuitry in the substrate. One end of the wire is then joined to the portion of the pad joined to the device. The other end of the pad was joined to another EC pad that had been similarly severed. Thus, an electrical connection is made between any terminal of any device on the substrate, and the former electrical lines buried in the substrate disconnected. The same technique can be used to substitute defective electrical lines in the substrate, and also to change the internal electrical network of the substrate.

While the EC structure works well, there are some notable disadvantages. The EC pads must be relatively large, compared to device pads in order to accommodate wire bonding, and therefore occupy a great deal of space on the top surface of the substrate. As the integrated circuit devices become more miniaturized with more circuits, and the number of required device pads also increases, the additional device pads require additional EC pads. With the size of the EC pads constrained to accommodate wire bonding, the total area required increases dramatically.

The EC pads on the substrate surface have a different metallurgy than the pads that are joined to the devices. This requires that a different set of process steps be applied to the same surface which makes the substrate more costly than if a single metallurgy could be used throughout the entire surface area. It also detracts from the yield of the substrate fabrication. As the number of EC pads increase, the number of lines required for making changes also increases. At some point the volume of wires becomes prohibitive. In addition, the wires, particularly longer wires, present problems with inductive coupling. This factor in a computer application is very serious. Still further, the EC wires reduce the speed of operation.

The length of the engineering change wires can be reduced by the technique and structure described and claimed in U.S. Pat. No. 4,489,364. In this structure buried EC lines in the X and Y directions are provided in the substrate. The buried lines periodically surface on the substrate with the line segments joined by a deletable engineering change pad. With these buried lines electrical lines can be formed from any location on the substrate. The EC connections thus consist of very short wires on the substrate. However this technique fails to alleviate the large area requirement for EC pads discussed previously.

SUMMARY OF INVENTION

An object of this invention is to provide a new and improved method and structure for modifying an inaccessible circuit network in a module substrate that supports and interconnects a plurality of integrated circuit devices.

Another object of this invention is to provide a new method and structure for making circuit changes in a module substrate for a plurality of devices wherein the area dedicated to engineering change pads is reduced.

Yet another object of this invention is to provide an engineering change method and structure wherein the surface metallurgy pad structure on the module substrate is similar.

Another object of this invention is to provide an engineering change method and structure wherein the conventional bonded wires are replaced with "tailored" semiconductor devices.

In accordance with the aforementioned objectives of the invention, there is provided a module for an array of integrated circuit devices where the module includes a substrate of insulating material having an upper surface and sets of pads thereon for the connection of integrated circuit devices, metallization beneath the surface of the substrate, device solder pads on the surface for connection to the pads of the devices, engineering change solder pads adjacent to the devices connected to the circuitry, fan-out metallization lines joining the device pads to the respective engineering change surface pads, engineering change pad lines including a plurality of periodically spaced surface breaks, connection vias extending to the surface from the ends of the breaks, engineering change line solder pads over the connection vias, a deletable line joining each pair of engineering change line solder pads, engineering change devices having connection pads arranged to match selected engineering change pads and engineering change line pads on the substrate, a tailorable metallurgy system on the EC device adapted to selectively join the connection pads thereon, the engineering change device when bonded to the substrate adapted to selectively join the engineering change pad to associated adjacent engineering change line pads to thereby modify the internal circuitry of the substrate.

A method of modifying the electrical connections of a plurality of integrated circuit devices mounted on the substrate of a module that are electrically interconnected by an internal metallurgy system within the substrate wherein the steps include, providing on the substrate engineering change solder pads that are electrically connected to terminals of mounted integrated circuit semiconductor devices; providing engineering change lines in the substrate, providing spaced breaks in said lines and connection pads, and a deletable line between pads providing engineering change devices with solder pads and a tailorable metallurgy system for selectively electrically connecting the solder pad engineering change device to the engineering change pads and engineering change lines on the substrate by solder reflow techniques, tailoring the engineering change device and joining it to the substrate.

BRIEF DESCRIPTION OF THE DRAWINGS

In the accompanying drawings forming a material part of this disclosure

FIG. 2 is a schematic view in perspective that illustrates buried EC lines in the substrate and their relationship to deletable EC pads and integrated circuit devices.

FIGS. 3 and 4 are detailed views of structures for interconnecting X and Y lines on EC devices.

FIG. 6 is a schematic view of buried EC lines in the substrate between devices, which illustrates an EC line connection between two spaced devices.

FIG. 7 is a plan view, in enlarged scale, of a surface metallurgy pattern on the substrate, similar to the pattern in FIG. 1.

DISCLOSURE OF THE INVENTION

Figure 1:
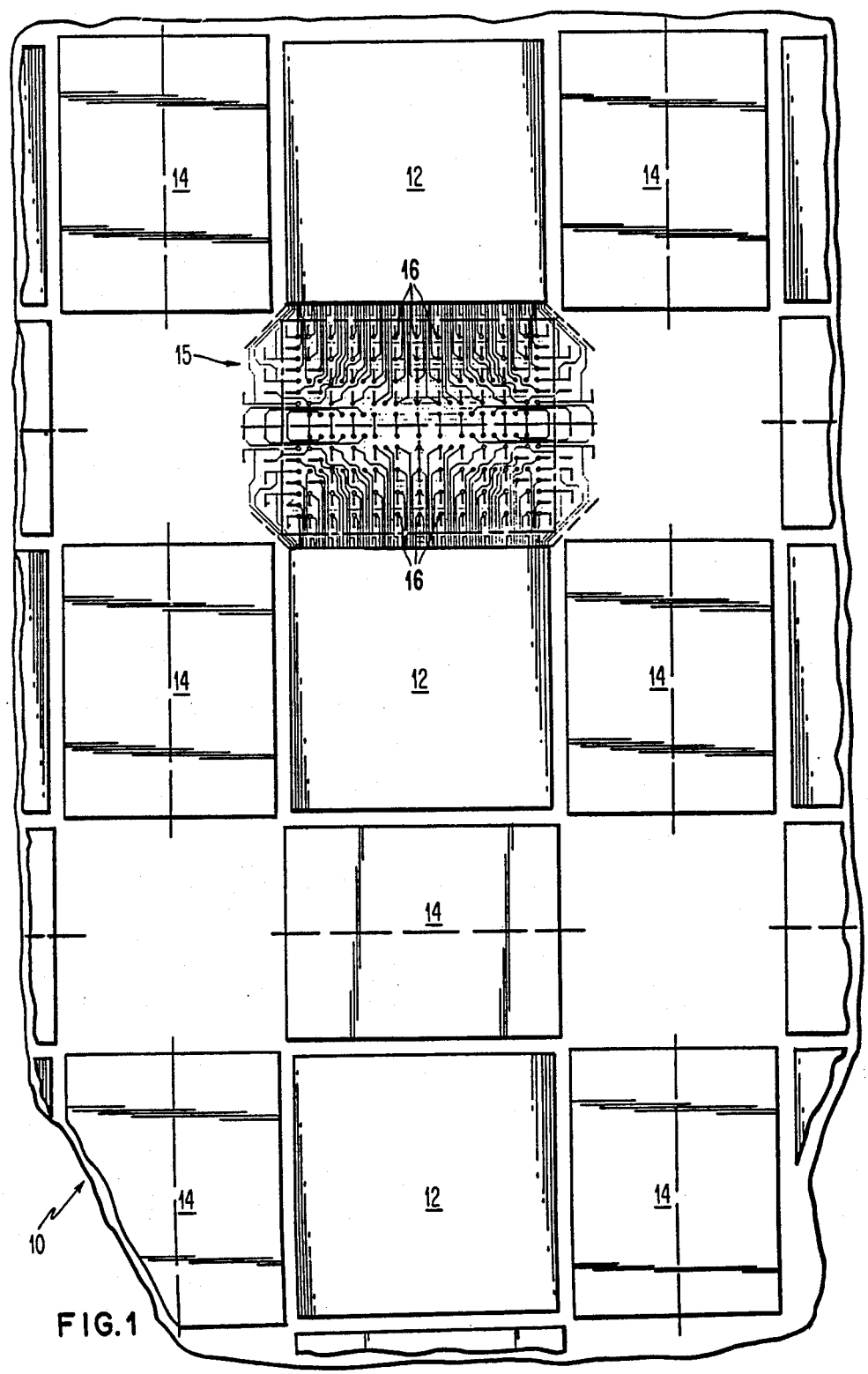
FIG. 1 is a top plan view in broken section of a portion of a module substrate illustrating the placement of integrated circuit devices, EC devices, and EC lines.

Referring now to the drawings, and FIG. 1 in particular, there is illustrated a top view of a module substrate 10 including integrated circuit devices 12, error correction devices 14 which can be tailored to make desired wiring changes and bonded to the substrate, and a typical fan-out pattern 15 terminating in EC pads 16. Similar fan-out patterns (not shown) underlie all devices 14. The substrate 10 is typically a multilayer ceramic (MLC) substrate of the type described in U.S. Pat. No. 4,245,273. Substrate 10 is formed of a plurality of laminated green ceramic sheets that have been punched to form via holes and a conductive metal line pattern formed thereon. The conductive lines collectively form an internal metallurgy system that interconnects the devices 12 with each other and to a suitable I/O terminals on the opposite side, not shown. The laminated sheet assembly is subsequently sintered forming a unitary body. The substrate is provided with a fan-out pattern 15 in positions underlying devices 14, which can be either formed as a separate surface metallurgy layer with an overlying dielectric layer, as illustrated in FIG. 1, or in the top surface layers of the substrate (not illustrated). The fan-out layer, as more clearly indicated in larger scale in FIG. 6, consists basically of conductive lines 13 that connect the I/O pads on the surface of substrate 10 joined to the terminals of the device 12 with EC pads 16 on the top surface of the substrate, located in the area between the devices 12. The end of each line 13 terminates in an EC pad 16 and a short deletable line portion 17 wherein the fan-out line can be disconnected from the internal metallurgy of substrate 10. Both the device I/O pads and the EC pads are preferably solder wettable pads which are joined to the terminals of the integrated circuit devices 12 and terminals of EC devices 14 by solder connections, and described in U.S. Pat. No. 3,429,040.

Also included in substrate 10 is a plurality of buried engineering change (EC) lines 18 in the X direction and a plurality of buried EC lines 20 in the Y direction, as illustrated schematically in FIG. 2. As indicated, both X lines 18 and Y lines 20 surface periodically on the surface of the substrate 10 as solder pads 26 and 22. Deletable links 23 and 24 join the adjacent pads 22 and 26 thus forming continuous metal stripes. Pads 22 and 26 are solder wettable. Links 23 and 24 can be either covered with a thin dielectric layer or have a top surface layer that is not solder wettable. This will constrain the solder to the pads 22 and 26 when the solder mass used to make the solder connection is heated to a molten state. The buried EC lines are described in U.S. Pat. No. 4,489,364. The fan-out pattern 15, as illustrated in FIG. 1, is repeated on each side of devices 12. In general, it is symmetrical about a center line with one-half of the fan-out pattern associated with one device, and the other side associated with the adjacent device 12. Preferably the pads 22 and 26 joined to the buried EC lines are located in the center area as shown. The fan-out pattern that provides electrical connections between the electrical pads beneath devices 12 and EC pads 16 outside of the area covered by devices 12, is preferably a single layer of metallurgy which can be deposited using conventional deposition and etching techniques. The pads are formed with a solder-wettable top metal layer, i.e. copper. The link portion can be formed with at least the top layer of the metal that is not solder wettable. Alternately, the link portion can be covered with a thin dielectric layer. The deletable line portion 17 joined to EC pad 16 can be severed with a laser beam to isolate the fan-out strip 17 from the internal metallurgy of the substrate since it is on the surface. Adjacent sets of pads 22 and 26 connected to buried EC pads 18 and 20 can also be electrically isolated by severing portion 23 or 24. Preferably solder pads to buried EC lines in both the X and Y directions will be accessible in each fan-out pattern 15. Using conventional MLC technology, the lines in the X direction can be made to surface in a short stripe 24 which can be severed. Surface lead lines 25 (FIG. 7) joined to the ends of link 24 are joined to pads 26. The use of these pads will become apparent in the following explanation.

Engineering change EC devices 14 are each provided with a solder pad configuration that is the mirror image of the solder pad configuration of fan-out pattern 15. Devices 14 have a tailorable metallurgy system that will permit making electrical connections between the various solder pads of the fan-out pattern 15. In practice, the substrate 10 is tested to determine if any of the internal buried lines are defective, the appropriate lines severed in pattern 15 on substrate 10, the metallurgy device of 14 tailored to make the required electrical connections between the various pads to correct the substrate defects, and the device 14 joined to the substrate using solder joining techniques to join the respective solder pads. The same technique can be used to alter the circuit arrangement of the substrate, i.e. make engineering and design changes.

Figure 5:
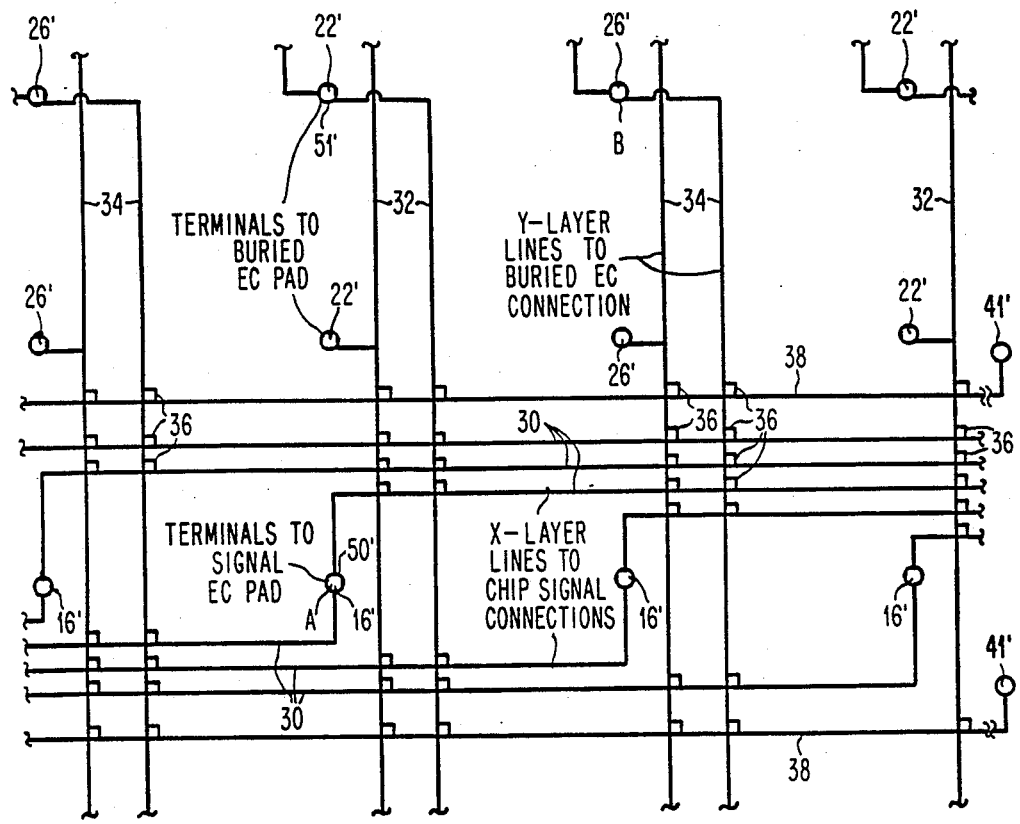
FIG. 5 is a scehmatic view of a portion of X-Y lines on an EC device illustrating their relationship to the EC pads and deletable links for tailoring the EC device.

Referring to FIG. 5 of the drawings, there is illustrated a schematic circuit diagram of a representative portion of the circuit of devices 14. There is a plurality of solder pads 16' arranged in a mirror image grid of the solder pads 16 on substrate 10. Each pad 16' is connected to a single stripe 30 that extends in the X direction. Preferably stripes 30 are all on a single metallurgy level. A similar set of stripes 30 and pads 16' (not shown) are provided beneath the set of stripes 30 of FIG. 5. The row of pads 16' associated with each set of stripes 30 is related to a similar row of EC pads 16 on substrate 10. A plurality of pads 22' are joined to stripes 32 that extend in the Y direction. A set of pads 26' joined to stripes 34 are located between stripes 32. Pads 22' and 26' correspond in placement and spacing to pads 22 and 26 on substrate 10. The stripes 32 and 34 are preferably formed in the same metallurgy layer which is electrically isolated from stripes 30 by a suitable dielectric layer. Surface pads 22' and 26' are solder wettable. At each juncture of stripes 30, and 32 and 34, there is provided a deletable connection 36. Connection 36 can be a connection 36A, as illustrated in FIG. 3 or connection 36B, as illustrated in FIG. 4. Connection 36A is a personalized connection that is selectively formed on EC device 14 after it has been determined which connections must be made to form the proper EC changes. The printed connection 36A is made to connect vias 38 and 40 by suitable deposition and subtractive etching techniques that are well-known in the art. If the top stripe is not covered by a dielectric layer, the connection is made directly to the exposed stripe, without the need for a via. Device 14 is formed without connections 36A, and tailored by adding the needed connections after they have been determined.

In contrast, the fusable link stripes 36B are formed during the metallization of the device 14. Link 36B has a thin portion which can be blown by applying a suitable electrical current across the connection, using pads 16', 22' and 26' as terminals. After it has been determined which connections are needed to make the EC changes, the remaining links are broken. Links 36B can also be broken with a laser pulse.

The aforedescribed metallurgy lines can be used to interconnect any solder pad 16 to any EC pad 22 or 26 on substrate 10.

Stripes 38 which extend in the X direction and are preferably in the same metallurgy layer as stripes 30' can be used to join EC pads 22, associated with EC lines in the Y direction, to EC pads 26, associated with EC lines in the X direction in substrate 10. Lines are each joined to a pad 41' which can be joined to similarly placed solder pads 41 on substrate 10. The primary use, however, of pad 41' is to provide an electrical connection to blow out the unneeded links 36. For example, in FIG. 5, pad 26' can be connected to pad 22' by leaving or forming the link connections 36 at the juncture of stripe 34 and stripe 38, and the juncture of stripe 38 and stripe 32. All of the remaining links on stripe 38 are severed or never formed, depending on the type of link. The same connection described could be formed between stripes 34 and 32 with stripe 30. However, these stripes are associated with EC pads 16 connected to fan-out stripe connections, in turn connected to active I/O's on the device 12. Such use would likely disrupt the device function and therefore is undesirable.

In order to illustrate how an engineering change is made for connecting I/O's from two different spaced integrated circuit devices 12 on substrate 10, a specific description of the steps involved will now be presented. At each of the two selected integrated circuit devices, the fan-out line 50 (FIG. 7) is electrically isolated from the internal electrical network of substrate 10 by severing the stripe portion 52. The metallurgy pattern on device 14 is then tailored to connect the solder pad 50 to 51. The method of making a connection in the device metallurgy between an I/O fan-out pad and an engineering change line pad was described previously. A similar procedure is used to join the I/O terminal of the integrated circuit device 14 to an engineering change line connection 53 (for FIG. 6). In order to make an electrical connection between the points 53 and 55, a connection 44 between pads 22 and 26, under a different EC device pad 14 located at the intersection of the chosen X and Y EC lines 18 and 20 respectively must be established in EC device 14 overlying the intersecting lines. The procedure for tailoring the metallurgy system of device 14 to interconnect EC pads from an X and Y EC lines, i.e. pads 22' and 26' was described previously. The delete stripes 52 and 54 are severed to isolate a segment of EC line 18. Delete stripes 56 and 58 are severed to electrically isolate a segment of EC line 20. After the respective metallurgy systems of the EC devices have been properly tailored, the devices are joined to the solder pads associated with the respective pads of the fan-out patterns 15. This establishes an engineering change connecting lead points 53 to 55 which are each connected in turn to selected I/O terminals under different separated integrated circuit devices as previously described in connecting solder pads 16 to 22.

An alternate method of forming an electrical connection between buried EC lines in the X direction, and EC lines in the Y directions is presented. A row of solder pads 41 (FIG. 7) can be provided along the edge of fan-out pattern 15-on substrate 10. Lines, either on the surface or buried, join these pads to similar placed pads under the adjacent EC devices which pads are connected to EC lines that extend in the X direction. Pads 41', (FIG. 5) are connected to pads 41 (FIG. 7) of device 10. Thus, the link connection 36 can be made on EC device metallurgy to join solder pads 22, which are connected to the EC lines that extend in the Y direction to solder pads in the adjacent device that are joined to EC lines in the X direction.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

I claim:

1. A module supporting and interconnecting an array of integrated circuit semiconductor devices, said module comprising a substrate of insulating material having an upper surface with sets of device solder pads thereon joined to terminals of said integrated circuit semiconductor devices, metallization beneath the surface of said substrate for electrically interconnecting said integrated circuit semiconductor devices, engineering change solder pads adjacent said sets of solder pads connected to said metallization, fan-out metallization lines on said substrate joining said device solder pads to the respective engineering change solder pads, embedded engineering change lines in said substrate having a plurality of periodically spaced breaks, connection vias extending to said upper surface from the ends of said lines at the breaks, engineering change line solder pads over said connection vias, a deletable line joining each pair of engineering change line solder pads, engineering change devices having connection pads arranged to match said engineering change solder pads and engineering change line solder pads on said substrate, a tailorable metallurgy system on said engineering change devices adapted to selectively electrically connect said connection pads thereon, said engineering change devices bonded to said substrate in use adapted to selectively join engineering change pads to associated adjacent engineering change line pads to thereby modify said metallization of said substrate.

2. The module of claim 1 wherein said substrate is a multilayer ceramic substrate with an internal metallurgy system for electrically interconnecting integrated circuit devices mounted on the surface.

3. The module of claim 1 wherein said metallization of said substrate includes a deletable metallurgy stripe portion on the surface and adjacent each of said engineering change solder pads.

4. The module of claim 1 wherein said fan-out metallization lines are located in a single layer on the top surface of said substrate, and said retallization lines are covered with a layer of dielectric material.

5. The module of claim 4 wherein said layer of dielectric material is polyimide.

6. The module of claim 1 wherein said embedded engineering change lines are comprised of a first set of parallel lines in the X direction, and a second set of parallel lines in the Y direction.

7. The module of claim 6 wherein said engineering change line solder pads are located between said device solder pads.

8. The module of claim 1 wherein all electrical connections between said integrated circuit devices and said devices and said device solder pads are solder reflow.

9. The module of claim 8 wherein all electrical connections between said connection pads on said engineering change devices, and said engineering change pads and engineering change line pads are solder reflow connections.

10. The module of claim 1 wherein said tailorable metallurgy system on each engineering change device is comprised of a plurality of parallel conductive lines in the X direction, a plurality of parallel conductive lines in the Y direction, a layer of dielectric material separating said pluralities of conductive X and Y lines, a deletable electrical connection adjacent each of the intersections of said conductive X and Y lines that electrically join the respective lines, and connection pads joined to each of said X and Y lines.

11. The module of claim 10 wherein said deletable electrical connections are each comprised of a thin fusable conductive line.

12. The module of claim 1 wherein said tailorable metallurgy system on each engineering change device is comprised of a plurality of parallel lines in the X direction, a plurality of parallel conductive lines in the Y direction, a layer of dielectric material separating said pluralities of conductive X and Y lines, a plurality of metal lines selectively tailored to the specific rework application at each of the intersections of said conductive X and Y lines that electrically join the respective lines, and connection pads joined to each of said X and Y lines.

13. A method of modifying the electrical interconnection of a plurality of integrated circuit devices mounted on the substrate of a module and electrically interconnected by an internal metallurgy system within the substrate comprising, providing on said substrate engineering change solder pads that are electrically connected to terminals of intergrated circuit devices, providing embedded engineering change lines in said substrate, providing periodically spaced breaks in said engineering change lines and connection vias at the end of said lines at the breaks that extend to the surface of said substrate, engineering change line solder pads over each via, and deletable surface lines joined to each pair of adjacent engineering change line solder pads associated with a break, providing engineering change devices with a set of solder pads arranged in a pattern to match said engineering change solder pads and engineering change line solder pads associated with at least one integrated circuit device, and a tailorable metallurgy system for selectively electrically connecting solder pads on said engineering change device, tailoring said metallurgy system of said engineering change devices to achieve the desired change in the metallurgy system of said substrate, joining the solder pads on said engineering change devices to the engineering change pads and engineering change line pads on said substrate by solder reflow techniques.

14. The method of claim 13 wherein each engineering change device is provided with fusable metal lines that electrically connect portions of said tailorable metallurgy system, selectively deleting all fusible metal lines with the selected application of electrical currents leaving those portions of the tailorable metallurgy system necessary to effect only the desired changes in the metallurgy system of the substrate.

15. The method of claim 13 wherein deletable surface lines on said substrate that join engineering change line solder pads are selectively severed to isolate relevant portions of the embedded engineering change lines that are involved in the modifying the electrical interconnections of the device on the substrate.

16. The method of claim 13 wherein each engineering change device is provided with a first set of parallel conductive lines in the X direction, and a second set of parallel conductive lines in the Y direction, said tailoring of said engineering change device achieved by depositing conductive links that selectively connect pairs of lines of said first and second sets of lines.

17. In a semiconductor module with a substrate having a plurality of semiconductor devices connected to device terminals on the upper surface thereof, an internal metallurgy system interconnecting the devices, an auxiliary set of conductive lines with periodically occurring surface connecting terminals, engineering change terminals with electrical connection to the device terminals and to the internal metallurgy system, the improvement comprising, engineering change devices, terminal means on said engineering change devices to establish electrical contact with said engineering change terminals, and said surface connecting terminals, a tailorable metallurgy system which permits selective electrical contact with individual terminals of said terminal means, means on said substrate to selectively electrically isolate certain engineering change terminals from said internal metallurgy system.

* * * * *